(12) United States Patent
Kawaguchi et al.

(10) Patent No.: US 9,606,431 B2
(45) Date of Patent: Mar. 28, 2017

(54) IMPRINTING DEVICE AND IMPRINTING METHOD

(71) Applicant: SCIVAX CORPORATION, Kanagawa (JP)

(72) Inventors: Hirosuke Kawaguchi, Tokyo (JP); Satoru Tanaka, Tokyo (JP)

(73) Assignee: SCIVAX CORPORATION, Kanagawa (JP)

( * ) Notice: Subject to any disclaimer, the term of this patent is extended or adjusted under 35 U.S.C. 154(b) by 331 days.

(21) Appl. No.: 14/359,647

(22) PCT Filed: Nov. 21, 2012

(86) PCT No.: PCT/JP2012/080245
§ 371 (c)(1),
(2) Date: May 21, 2014

(87) PCT Pub. No.: WO2013/077386
PCT Pub. Date: May 30, 2013

(65) Prior Publication Data
US 2014/0319718 A1 Oct. 30, 2014

(30) Foreign Application Priority Data
Nov. 25, 2011 (JP) .................................. 2011-258353

(51) Int. Cl.
*B29C 43/00* (2006.01)
*G03F 7/00* (2006.01)
(Continued)

(52) U.S. Cl.
CPC ............ *G03F 7/0002* (2013.01); *B29C 59/02* (2013.01); *B29C 59/022* (2013.01);
(Continued)

(58) Field of Classification Search
CPC ..... G03F 7/0002; B29C 59/02; B29C 59/022; B29C 2059/023
(Continued)

(56) References Cited

U.S. PATENT DOCUMENTS 5,078,947 A * 1/1992 Nishizawa .......... B29C 35/0888
264/1.1
5,242,731 A 9/1993 Shimizu et al.
(Continued)

FOREIGN PATENT DOCUMENTS

JP 3-280229 A 12/1991
JP 2006-018977 A 1/2006
(Continued)

OTHER PUBLICATIONS

International Search Report and Written Opinion for International Application No. PCT/JP2012/080245, 7 pages.

*Primary Examiner* — Timothy Kennedy
(74) *Attorney, Agent, or Firm* — Factor Intellectual Property Law Group, Ltd.

(57) ABSTRACT

An imprinting device to transfer the mold pattern on a die to a molding target includes a casing forming a pressure-adjusting chamber, a stage supporting the die and the molding target, a frame encircling a circumference of the stage, first moving means moving the casing and the stage in a direction coming close to each other or becoming distant from each other, second moving means moving the casing and the frame in a direction coming close to each other or becoming distant from each other, pressure-adjusting means that adjusts the pressure of a fluid in the pressure-adjusting chamber, and decompression means which decompresses a decompression chamber formed by the stage, a frame, and the die or the molding target, and which eliminates a fluid present between the die and the molding target.

11 Claims, 4 Drawing Sheets (51) Int. Cl.
  *B29C 59/02* (2006.01)
  *H01L 21/56* (2006.01)
(52) U.S. Cl.
  CPC ...... *H01L 21/565* (2013.01); *B29C 2059/023* (2013.01); *B29C 2791/006* (2013.01)
(58) Field of Classification Search
  USPC ................................ 425/385, 174.4; 264/496
  See application file for complete search history.

(56) References Cited

U.S. PATENT DOCUMENTS

| | | | | |
|---|---|---|---|---|
| 5,623,368 | A | * | 4/1997 | Calderini ................ B29C 59/02 264/2.5 |
| 5,669,303 | A | * | 9/1997 | Maracas ................ B05C 1/027 101/327 |
| 5,937,758 | A | * | 8/1999 | Maracas ................ B82Y 10/00 101/327 |
| 5,947,027 | A | * | 9/1999 | Burgin ................... B82Y 10/00 101/327 |
| 2004/0131718 | A1 | * | 7/2004 | Chou .................... G03F 7/0002 425/385 |
| 2005/0172848 | A1 | * | 8/2005 | Olsson ................... B81C 1/0046 101/493 |
| 2006/0006580 | A1 | * | 1/2006 | Olsson ................... B29C 59/022 264/293 |
| 2006/0038309 | A1 | * | 2/2006 | Korenaga ............. B29C 43/021 264/2.7 |
| 2006/0272535 | A1 | * | 12/2006 | Seki ....................... B82Y 10/00 101/492 |
| 2007/0035717 | A1 | | 2/2007 | Wu et al. |
| 2007/0278712 | A1 | * | 12/2007 | Okushima ............. B82Y 10/00 264/236 |
| 2009/0026658 | A1 | * | 1/2009 | Hosoda ................. B29C 59/022 264/319 |
| 2011/0273684 | A1 | * | 11/2011 | Owa ....................... B29C 43/003 355/53 |
| 2011/0298159 | A1 | * | 12/2011 | Jang ....................... B82Y 10/00 264/447 |

FOREIGN PATENT DOCUMENTS

| | | |
|---|---|---|
| JP | 2008-221706 A | 9/2008 |
| JP | 2010-507230 A | 3/2010 |
| WO | 2012/147958 A1 | 1/2012 |

* cited by examiner

IMPRINTING DEVICE AND IMPRINTING METHOD

RELATED APPLICATIONS

This application is a national phase of International Patent Application No. PCT/JP2012/080245, filed Nov. 21, 2012, which claims the filing benefit of Japanese Patent Application No. 2011-258353, filed Nov. 25, 2011, the contents of both of which are incorporated herein by reference.

TECHNICAL FIELD

The present disclosure relates to an imprinting device and an imprinting method which transfer a fine pattern of a die to a molding target.

BACKGROUND ART

Conventionally, nano-imprinting technologies are known as a method for forming a fine pattern in a micro order or in a nano order. According to this method, a die with a fine pattern is pressed against a molding target like a resin, and such a pattern is transferred to the molding target by heat or light (see, for example, Patent Literature 1). In addition, in order to increase a transfer area, an imprinting device has been proposed which presses flexible die and molding target by fluid pressure (see, for example, Patent Literature 2).

CITATION LIST

Patent Literature

Patent Literature 1: WO2004/062886
Patent Literature 2: JP 2009-154393 A

SUMMARY OF INVENTION

Technical Problem

According to conventional imprinting devices, however, a decompression chamber is formed so as to cover a pressure chamber, and thus the devices become large in size.

In addition, according to conventional devices, in order to surely eliminate a fluid between a die and a molding target, it is necessary to additionally provide a separator that makes the die and the molding target separating from each other. Hence, the devices become further large in size, and the costs increase.

Therefore, it is an objective of the present disclosure to provide an imprinting device and an imprinting method which can downsize the device, and which can decrease costs.

Solution to Problem

To accomplish the above objective, an imprinting device of the present disclosure transfers a mold pattern on a die to a molding target, and includes: a casing forming a pressure-adjusting chamber; a stage supporting the die and the molding target; a frame encircling an outer circumference of the stage; first moving means that moves the casing and the stage in a direction coming close to each other or becoming distant from each other; second moving means that moves the casing and the frame in a direction coming close to each other or becoming distant from each other; pressure-adjusting means that adjusts pressure of a fluid in the pressure-adjusting chamber; and decompression means which decompresses a decompression chamber formed by the frame and the die or the molding target, and which eliminates the fluid present between the die and the molding target.

In this case, it is preferable that the imprinting device should further include pressure-difference adjusting means that adjusts a pressure difference between the pressure-adjusting chamber and the decompression chamber. For example, a communication channel that causes the pressure-adjusting chamber and the decompression chamber to be in communication with each other is applicable. It is preferable that the frame should include fluid spray means that sprays the fluid to a space between the die and the molding target. In this case, it is appropriate if the fluid spray means is disposed at positions facing with each other across the molding target. It is preferable that the imprinting device should include pressure-adjusting-chamber sealing means that air-tightly seals the pressure-adjusting chamber, or decompression-chamber sealing means that air-tightly seals the decompression chamber. In addition, the imprinting device may include a flexible film provided between the pressure-adjusting chamber and the die or the molding target. The imprinting device may include temperature adjusting means that adjusts a temperature of the molding target. The imprinting device may include light emitting means that emits light to the molding target. Still further, the imprinting device may include a carrier including a feeding roller that supplies the molding target, and a collecting roller that collects the molding target having undergone mold pattern transfer.

An imprinting method of the present disclosure is for transferring a mold pattern on a die to a molding target, and includes: a disposing step for disposing the die and the molding target on a stage; a holding step for holding, by a casing forming a pressure-adjusting chamber, and a frame encircling a circumference of the stage, either one of the die or the molding target located at the casing side; a separating step for separating the casing and the stage relative to each other; an eliminating step for eliminating a fluid present between the die and the molding target; an intimate contact step for causing the die and the molding target to intimately contact each other; and a transferring step for transferring the mold pattern on the die to the molding target.

In this case, it is preferable that the imprinting method should further include a demolding step for moving the frame and the stage relative to each other to form a gap between the die and the molding target, and for spraying a fluid to the gap from fluid spray means provided at the frame. In addition, thermal imprinting which heats the molding target to a temperature equal to or higher than a glass transition temperature, and pressurizes the die and the molding target by a fluid in the pressure-adjusting chamber, or optical imprinting which pressurizes the die and the molding target by a fluid in the pressure-adjusting chamber, and emitting light to the molding target is applicable in the transferring step.

Advantageous Effects of Invention

According to the imprinting device and the imprinting method of the present disclosure, a decompression chamber is provided at a stage-side using a frame movable relative to a casing and the stage, and thus the device can be downsized. In addition, either one of a die or a molding target is held by the casing and the frame, and the casing and the stage are moved relative to each other. Accordingly, the casing, the frame, and the stage serve as a separator, and thus the device can be further downsized, and the costs can be further reduced.

It is to be understood that the aspects and objects of the present invention described above may be combinable and that other advantages and aspects of the present invention will become apparent upon reading the following description of the drawings and detailed description of the invention.

While this invention is susceptible of embodiment in many different forms, there is shown in the drawings and will herein be described in detail one or more embodiments with the understanding that the present disclosure is to be considered as an exemplification of the principles of the invention and is not intended to limit the invention to the embodiments illustrated.

DESCRIPTION OF EMBODIMENTS

Figure 1:
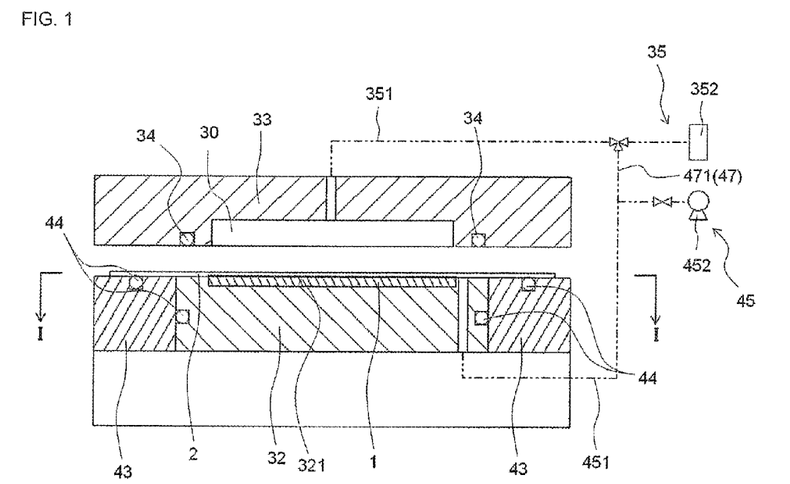
FIG. 1 is a partial cross-sectional view illustrating an imprinting device of the present disclosure.
Figure 2:
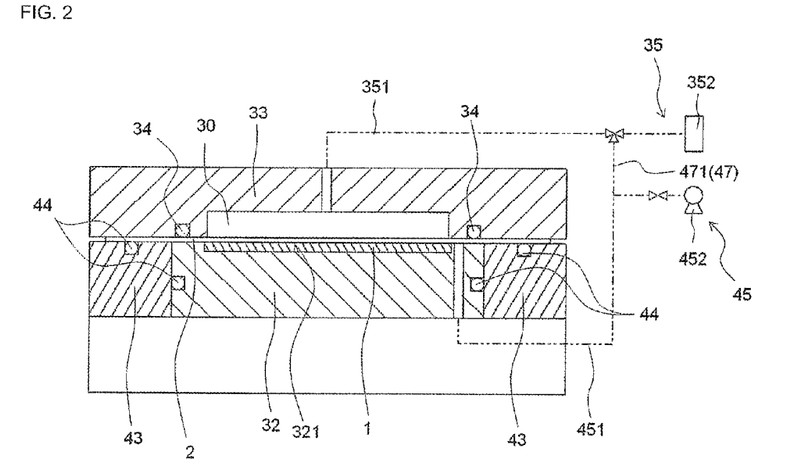
FIG. 2 is a partial cross-sectional view illustrating the imprinting device of the present disclosure.
Figure 3:
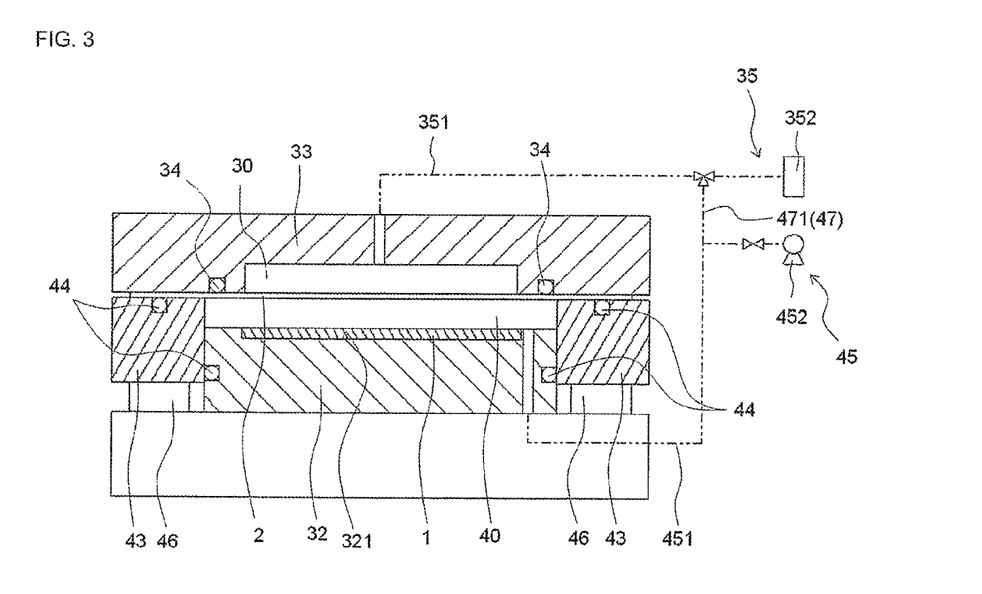
FIG. 3 is a partial cross-sectional view illustrating the imprinting device of the present disclosure.
Figure 4:
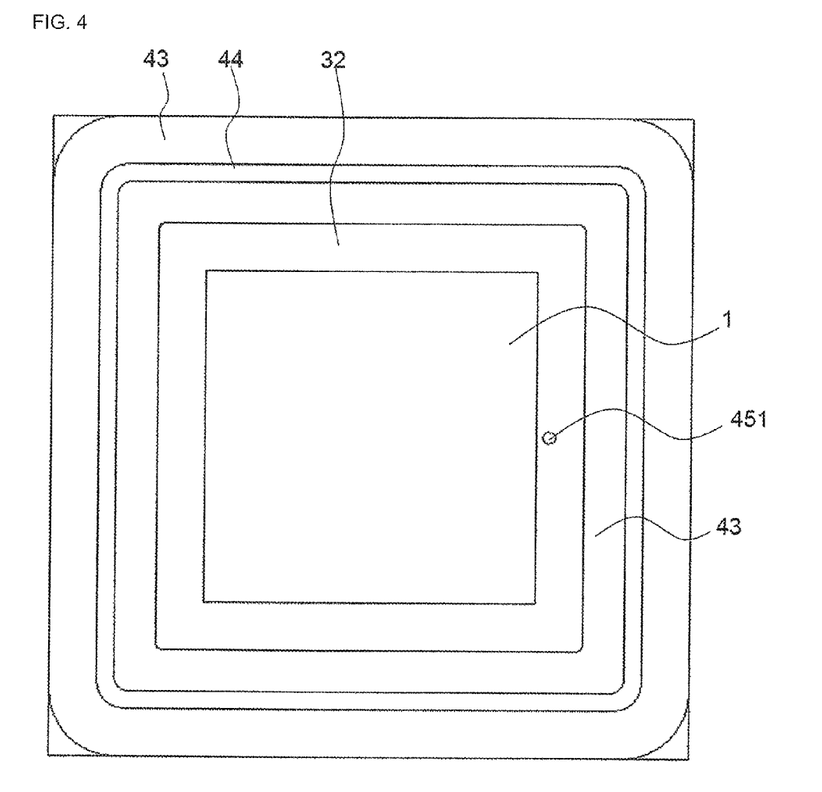
FIG. 4 is a plan view in a direction taken along a line I-I in FIG. 1.

FIGS. 1 to 3 illustrate an imprinting device of the present disclosure which transfers a mold pattern on a die 1 to a molding target 2, and includes a casing 33 forming a pressure-adjusting chamber 30, a stage 32 supporting the die 1 and the molding target 2, a frame 43 surrounding the circumference of the stage 32, first moving means (unillustrated) that can move the casing 33 and the stage 32 relative to each other in a direction coming close to each other or in a direction becoming distant from each other, second moving means 46 that can move the casing 33 and the frame 43 relative to each other in a direction coming close to each other or in a direction becoming distant from each other, pressure-adjusting means 35 that adjusts the pressure of a fluid in the pressure-adjusting chamber 30, and decompression means 45 which decompresses a decompression chamber 40 formed by the stage 32, the frame 43, and the die 1 or the molding target 2, and which eliminates a fluid between the die 1 and the molding target 2.

In this specification, the die 1 is formed of, for example, "metal like nickel", "ceramics", "carbon material like glass-like carbon", or "silicon", and has a predetermined mold pattern formed on one end face (molding surface). This mold pattern can be formed by performing precise machining on the molding surface. In addition, such a pattern can be formed by performing a semiconductor microfabrication technology like etching on a silicon substrate, or forming a metal plating on the surface of the silicon substrate, etc., by electro forming technique, such as nickel plating, and by peeling the metal plating layer. Still further, a resin-made die formed through imprinting is also applicable. In this case, the die can be formed as a film flexible relative to the molding-target surface of the molding target. Needless to say, the material of the die 1 and the manufacturing method thereof are not limited to any particular ones as long as a mold pattern can be transferred.

The mold pattern formed on the die 1 includes, not only a geometric shape formed of concavities and convexities, but also a shape to transfer a predetermined surface condition like a mirror surface transfer having a predetermined surface roughness. In addition, the mold pattern is formed in various sizes such that the minimum dimension of the width of the convexity in the planar direction and that of the width of the concavity are equal to or smaller than 100 µm, equal to or smaller than 10 µm, equal to or smaller than 2 µm, equal to or smaller than 1 µm, equal to or smaller than 100 nm, and equal to or smaller than 10 nm. Still further, the dimension in the depthwise direction is also formed in various sizes, such as equal to or larger than 10 nm, equal to or larger than 100 nm, equal to or larger than 200 nm, equal to or larger than 500 nm, equal to or larger than 1 µm, equal to or larger than 10 µm, and equal to or larger than 100 µm.

The shape of the surface (molding surface) on which the mold pattern of the die is formed is not limited to a plane. For example, like a die to transfer a MOTH-EYE on a curved face of a lens, the molding face may be formed in a three-dimensional shape like a curved face.

The molding target 2 means a substrate or a film formed of a resin, an inorganic compound, or a metal, or a substrate or a film having a molding target layer 21 formed thereon and formed of a resin, an inorganic compound, or a metal. An example resin applied to the molding target 2 is a photo-curable resin, a thermosetting resin, or a thermoplastic resin.

An example photo-curable resin or thermosetting resin is an unsaturated hydrocarbon radical containing compound like vinyl radical, allylic radical, such as an epoxide containing compound, (metha) acrylic acid ester compound, a vinyl ether compound, or bis-allylic-nadimide compound. In this case, in order to permit a thermal polymerization, a polymerization reactive radial containing compound can be applied in solo, or in order to improve the thermosetting characteristic, a thermal reactive initiator may be added. In addition, a photo reactive initiator may be added, and a polymerization reaction may be progressed upon light emission to form a mold pattern. Example thermal reactive radial initiator applicable are an organic peroxide, and an azo compound. Example photo reactive radial initiator suitably applicable are an acetophenone derivative, a benzophenone derivative, a benzoin-ether derivative, and a xanthone derivative. Still further, a reactive monomer may be applied in a solvent-free condition, or may be dissolved in a solvent and subjected to desolvation after application.

Example thermoplastic resin applicable are a cyclic-olefin-based resin, such as a cyclic-olefin-ring-opening polymer/hydrogen additive (COP) or cyclic-olefin copolymer (COC), an acrylic resin, polycarbonate, a vinyl-ether resin, a fluorine-based resin, such as perfluoro-alkoxy-alkane (PFA) or polytetrafluorothylene (PTFE), polystyrene, a polyimide-based resin, and a polyester-based resin.

The molding target 2 may be formed as a flexible film, or may be formed as a layer on a substrate formed of an inorganic compound like silicon or a metal.

In FIG. 1, the die 1 is disposed at the stage-32 side, while the molding target 2 is disposed at the pressure-adjusting-chamber-30 side, but the molding target 2 may be disposed at the stage-32 side, while the die 1 may be disposed at the pressure-adjusting-chamber-30 side.

The casing 33 forms the pressure-adjusting chamber 30. In addition, it is preferable that the pressure-adjusting chamber 30 should directly or indirectly pressurize the die 1 and the molding target 2 by a fluid. For example, the casing 33 is formed in a cylindrical shape with an opening and a bottom, and the opening is closed by the die 1 or the molding target 2, thereby forming the pressure-adjusting chamber 30 that is an air-tightly closed space. This opening is formed so as to be larger than at least the molding surface of the die 1.

FIG. 2 illustrates an example case in which the pressure-adjusting chamber 30 is formed by the casing 33 and the molding target 2. According to this structure, the molding target 2 can be directly pressed against the die 1 by a fluid. The material of the casing 33 is not limited to any particular one as long as the casing can have a pressure resistance and a heat resistance to a molding condition in an imprinting process, and for example, a metal like stainless-steel is applicable.

In order to surly close the pressure-adjusting chamber 30, pressure-adjusting-chamber sealing means 34 may be further disposed which causes the casing 33 to intimately contact the die 1 or the molding target 2. For example, as illustrated in FIG. 2, an O-ring as the pressure-adjusting-chamber sealing means 34 is prepared, and a concaved groove shallower than the diameter of the cross-section of the O-ring is formed in an end of the side wall of the casing 33 at the stage side. The O-ring is disposed in this groove. According to this structure, the molding target 2 is held by the casing 33 and the stage 32, and the casing 33 can intimately contact the molding target 2, thereby air-tightly closing the pressure-adjusting chamber 30. The O-ring may be disposed so as to allow the molding target 2 to be held by the casing 33 and the frame 43.

Figure 6:
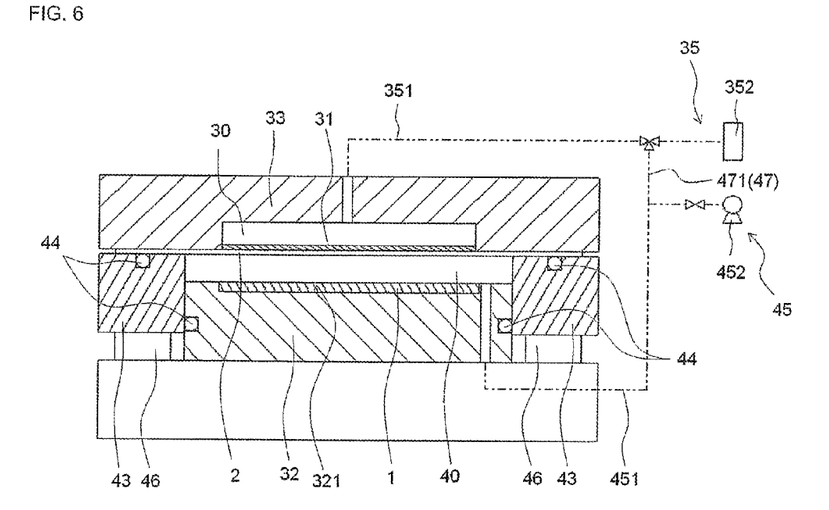
FIG. 6 is a partial cross-sectional view illustrating another imprinting device of the present disclosure.

In another embodiment, as illustrated in FIG. 6, the pressure-adjusting chamber 30 may be formed by the casing 33 formed in a cylindrical shape with an opening and a bottom, and a flexible film 31 that closes this opening. According to this structure, the die 1 and the molding target 2 can be indirectly pressurized through the film 31. Example material of the film 31 are a resin, a thin metal, and an elastic material like rubber. In addition, when a light source that emits light with a predetermined wavelength to the molding target 2 is provided at the pressure-adjusting-chamber-30 side, a light transmissive material is selected as the film 31. The film 31 can have any thickness as long as the flexibility can be maintained, but for example, is equal to or smaller than 10 mm, preferably, equal to or smaller than 3 mm, and further preferably, equal to or smaller than 1 mm. The casing 33 and the film 31 may be fixed together by a bond, etc., to air-tightly close the interior of the pressure-adjusting chamber. The casing 33 and the film 31 may be separate pieces, and the space between the casing 33 and the film 31 may be air-tightly closed by the aforementioned pressure-adjusting-chamber sealing means 34.

The stage 32 supports the die 1 and the molding target 2 to which the pressure of the fluid in the pressure-adjusting chamber 30 and other molding pressures are applied. A pressure-applied surface 321 of the stage 32 at a side contacting the die 1 or the molding target 2 is sufficiently large and smooth. This pressure-applied surface 321 can be formed as a plane or a curved face in accordance with the shape of the die 1 or that of the molding target 2 to be held. The material is not limited to any particular one as long as it has a pressure resistance and a heat resistance to the molding condition in an imprinting process, and for example, a metal like stainless-steel is applicable. In addition, when the die 1 or the molding target 2 is heated from the stage-32 side, it is preferable to apply a material having a high thermal conductivity like metal. Still further, when the die 1 or the molding target 2 is heated from the pressure-adjusting-chamber-30 side, a material having a low thermal conductivity is applicable in order to prevent the heat from being repelled to the stage 32, but it is preferable that the pressure-applied surface 321 should be formed of a material with a high thermal conductivity in order to suppress uneven heating. In the case of an optical imprinting process, when the light source is disposed at the stage-32 side, a transparent material like glass is applicable. In order to suppress an unnecessary transfer trace on the molding target 2, the die 1 may be formed integrally with the stage 32. For example, according to conventional technologies, a pattern is formed by electroforming, and only the pattern portion is cut out, but the member having undergone the electroforming is directly used without being cut out.

The frame 43 is disposed so as to surround the outer circumference of the stage 32, and is formed in a cylindrical shape that can retain thereinside the stage 32. It is preferable that an opening of the frame 43 should be formed in the substantially same shape as that of the stage 32 but slightly larger than the stage so as to minimize a gap formed between the opening of the frame 43 and the stage 32 as much as possible. Since the frame is formed in this manner, the frame 43 can be moved relative to the stage 32 to form the decompression chamber 40. In this case, the decompression chamber 40 decompresses the atmosphere around the die 1 and the molding target 2, in particular, the atmosphere between the die 1 and the molding target 2. Hence, gas present between the die 1 and the molding target 2 or present between those and the stage 32 is eliminatable, enabling uniform pressurization of the molding target 2 against the die 1. The material of the frame 43 is not limited to any particular one as long as it has a pressure resistance and a heat resistance to the molding condition in an imprinting process, and for example, a metal like stainless-steel is applicable.

In order to surly close the decompression chamber 40, decompression-chamber sealing means 44 may be further disposed which air-tightly closes a space between the frame 43 and the stage 32, and a space between the frame 43 and the die 1 or the molding target 2. For example, as illustrated in FIG. 1, an O-ring as the decompression-chamber sealing means 44 is prepared, and a concaved groove shallower than the diameter of the cross-section of the O-ring is formed in an end of the frame 43 at the casing-33 side. The O-ring is disposed in this groove. In addition, a concaved groove shallower than the diameter of the cross-section of the O-ring may be formed in the outer circumference (frame-43 side) of the stage 32, and the O-ring may be disposed in this groove. It is also appropriate if a concaved groove shallower than the diameter of the cross-section of the O-ring is formed in the inner circumference (stage-32 side) of the frame 43, and the O-ring is disposed in this groove.

The first moving means is unillustrated but is not limited to any particular mechanism as long as it can move the casing 33 and the stage 32 close to each other or move the casing and the stage apart from each other. For example, the stage 32 may be fixed to a certain position, and the casing 33 may be moved by a hydraulic or pneumatic cylinder, or may be moved by an electric motor and a ball screw. Needless to say, the casing 33 may be fixed to a certain position, and the stage 32 may be moved by the similar mechanism.

In addition, the second moving means 46 is not limited to any particular one as long as it can move the casing 33 and the frame 43 close to each other or move the casing and the frame apart from each other. For example, the casing 33 is fixed to a certain position, and the frame 43 is moved by a hydraulic or pneumatic cylinder, or by an electric motor and a ball screw. Needless to say, the frame 43 may be fixed to a certain position, and the casing 33 may be moved by the similar mechanism.

The pressure-adjusting means 35 decreases or increases the pressure in the pressure-adjusting chamber 30, thereby adjusting the pressure of the fluid. For example, a mechanism that can adjust the pressure of the fluid in the pressure-adjusting chamber 30 up to a pressure that enables a transfer of the pattern on the die 1 to the molding target 2 is applicable. More specifically, a pressure-adjusting-chamber gas supply/discharge channel 351 is connected to the casing 33, and a gas like air or inert gas may be supplied to or discharged from the pressure-adjusting chamber 30 through the pressure-adjusting-chamber gas supply/discharge channel 351. To supply such gas, a gas supply source 352 like a tank or a compressor containing compressed gas is applicable. In addition, to discharge the gas, it is not illustrated but the gas may be discharged by opening/closing a degassing valve. Note that a safety valve may be provided as needed.

The decompression means 45 reduces the pressure in the decompression chamber 40 formed by the stage 32, the frame 43, and the molding target 2 (or the die 1), and eliminates the fluid present at least between the die 1 and the molding target 2. For example, the decompression means includes a decompression-chamber gas supply/discharge channel 451 connected to the decompression chamber 40, and a decompression pump 452 that discharges gas in the decompression chamber 40 through the decompression-chamber gas supply/discharge channel 451.

It is preferable that pressure-difference adjusting means 47 that adjusts a pressure difference between the pressure-adjusting chamber 30 and the decompression chamber 40 should be provided. Accordingly, the pressure difference between the pressure-adjusting chamber 30 and the decompression chamber 40 can be made as small as possible. This suppresses a warpage of the die 1 or the molding target 2 present between the pressure-adjusting chamber 30 and the decompression chamber 40 due to a pressure difference, and the gas present between the die 1 and the molding target 2 can be surely eliminated. An example pressure-difference adjusting means 47 is a communication channel 471 that causes the pressure-adjusting chamber 30 and the decompression chamber 40 to be in communication with each other in an openable/closable manner. This structure easily decreases the pressure difference to be zero between the pressure-adjusting chamber 30 and the decompression chamber 40. The communication channel 471 may be provided in either one of the stage 32 or the frame 43. In addition, as illustrated in FIG. 1, the pressure-adjusting-chamber gas supply/discharge channel 351 and the decompression-chamber gas supply/discharge channel 451 may be utilized as a part of the communication channel 471. As another structure of the pressure-difference adjusting means, decompression means may be provided at the pressure-adjusting chamber 30, and the pressure difference between the pressure-adjusting chamber 30 and the decompression chamber 40 may be adjusted based on pressure sensors that detect respective pressures in the pressure-adjusting chamber 30 and the decompression chamber 40.

Figure 5:
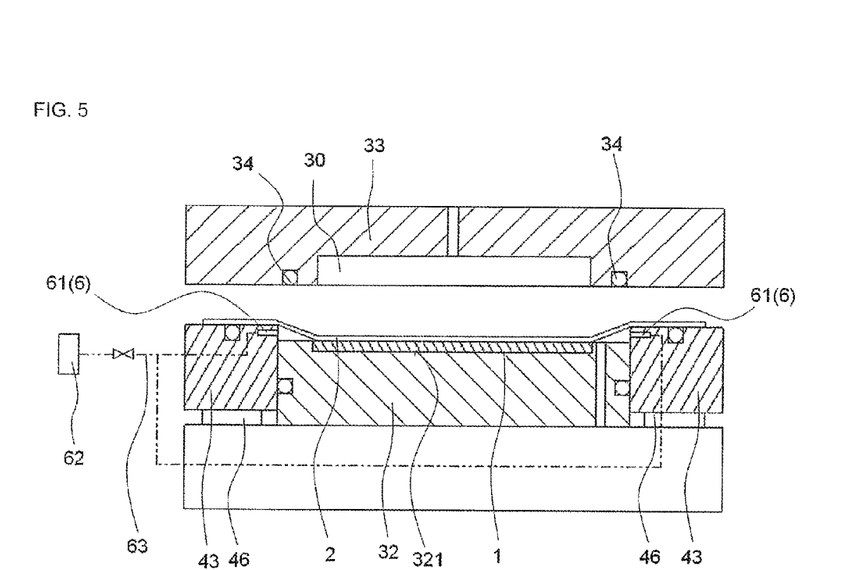
FIG. 5 is a partial cross-sectional view illustrating an imprinting device of the present disclosure.

As illustrated in FIG. 5, the imprinting device of the present disclosure may have fluid spray means 6 on the frame which sprays a fluid like gas between the die 1 and the molding target 2. According to this structure, the casing and the stage are spaced apart while the molding target 2 (or the die 1) being held by the casing and the frame to form a gap between the die 1 and the end of the molding target 2 intimately contacting with each other after a pattern transfer, and the fluid is sprayed to this gap, thereby enabling a demolding.

The fluid spray means 6 mainly includes, for example, spray nozzle 61 provided in the inner-circumferential side wall of the frame 43, and spraying the fluid between the die 1 and the molding target 2, fluid speed adjusting means (unillustrated) that adjusts the speed of the fluid sprayed from the spray nozzle 61, a demolding fluid supply source 62 that supplies a fluid to the spray nozzle 61, and a demolding fluid supply channel 63 to cause the fluid in the demolding fluid supply source 62 to flow through the spray nozzle 61.

The spray nozzle 61 can be a slit formed along the inner circumferential side wall of the frame 43. The width of the slit can be adjusted in accordance with the intimate contact force between the die 1 and the molding target 2, but for example, set to 0.2 to 0.5 mm. In addition, a multi nozzle having multiple orifices provided at an appropriate pitch along the end of the molding target 2 may be applied. The angle of the spray nozzle 61 can be set to be parallel to the direction in which the die 1 and the molding target 2 intimately contact each other or to the intimately contacting surfaces.

Still further, it is preferable that the spray nozzle 61 should be provided in two directions facing each other across at least the molding target 2, and more preferably, four directions. According to this structure, the fluids sprayed from the opposing positions collide at the center between the die 1 and the molding target 2. In this case, the fluids lose the velocity, and thus the pressure becomes static pressure from the dynamic pressure. Accordingly, the static pressure at the colliding portion becomes higher than the pressure on the upper face of the molding target 2, and thus the molding target 2 is lifted up. The energy of the fast-speed sprayed fluid is converted into the static pressure in this way, and the fluid instantaneously eliminates a peeling, a eddying flow, and shear force caused on the wall surface, thereby preventing the pattern transferred to the molding target 2 from being damaged, etc.

The fluid speed adjusting means is not limited to any particular one as long as it can adjust the flow speed of the fluid sprayed from the spray nozzle 61, but for example, a mechanism that adjusts the fluid speed based on pressure and a spraying time is applicable. More specifically, a fluid pressurized at 0.2 to 0.5 Mpa by an accumulator may be sprayed as pulses of 50 to 300 ms.

The demolding fluid supply source 62 can be an air compressor that feeds gas to the spray nozzle 61 or a tank that reserves thereinside compressed gas.

In addition, when the imprinting device of the present disclosure is applied to a thermal imprinting process, it is not illustrated in the figure but temperature adjusting means is further provided which adjusts the temperature of the molding target 2 by heating or cooling it. Example temperature adjusting means are a heater or a cooler that directly or indirectly heats or cools the molding target 2.

The heater is not limited to any particular one as long as it can heat either one of or both of the die 1 and the molding target 2 to a predetermined temperature, e.g., a temperature equal to or higher than the glass transition temperature of the molding target 2 or the melting temperature thereof. The molding target 2 may be heated from the stage-32 side or from the pressure-adjusting-chamber-30 side. For example, a heater may be provided in the stage 32 to heat the die 1 and the molding target 2 from the stage 32. In addition, a radiant heat source that performs heating by emitting electromagnetic waves, such as a ceramic heater or a halogen heater, may be provided in the pressure-adjusting chamber 30 to heat the die 1 and the molding target 2. Still further, heating may be performed using a heated liquid or gas.

The cooler is not limited to any particular one as long as it can cool either one of or both of the die 1 and the molding target 2 to a predetermined temperature, e.g., a temperature lower than the glass transition temperature of the molding target 2 or the melting temperature thereof. The molding target 2 may be cooled from the stage-32 side or from the pressure-adjusting-chamber-30 side. For example, a cooling water jacket may be provided in the stage 32 to cool the die 1 and the molding target 2 from the stage 32.

When the imprinting device of the present disclosure is applied to an optical imprinting process, it is not illustrated in the figure but a light source that emits electromagnetic waves with a predetermined wavelength to the molding target 2 may be provided in the pressure-adjusting chamber 30 or in the stage 32. In order to adjust the viscosity, etc., of the molding target 2, the aforementioned temperature adjusting means may be further provided.

It is not illustrated in the figure but a carrier that carries the molding target may be further provided. For example, a feeding roller that supplies a resin film (molding target), and a collecting roller that collects the resin film having undergone the mold pattern transfer may be disposed across the stage 32. This structure enables a continuous pattern transfer.

Next, an explanation will be given of an imprinting method of the present disclosure together with an operation of the imprinting device of the present disclosure. The imprinting method of the present disclosure transfers the mold pattern on the die 1 to the molding target 2, and mainly includes a disposing step for disposing the die 1 and the molding target 2 on the stage 32, a holding step for holding either one of the die 1 and the molding target 2 by the casing 33 forming the pressure-adjusting chamber 30, and the frame 43 surrounding the circumference of the stage 32, a separating step for separating the casing 33 and the stage 32 relative to each other, an eliminating step for eliminating the fluid present between the die 1 and the molding target 2, an intimately contact step for causing the die 1 to intimately contact the molding target 2, a transferring step for transferring the mold pattern on the die 1 to the molding target 2, and a demolding step for releasing the die 1 from the molding target 2.

In the disposing step, as illustrated in FIG. 1, the die 1 and the molding target 2 are disposed on the stage 32. At this time, the object disposed at the stage-32 side is disposed so as not to overlap the frame 43 on the stage 32, and the object disposed at the casing-33 side is disposed so as to be held by the frame 43 and the casing 33 apart from the stage 32, thereby at least partially overlapping the frame 43.

In the holding step, as illustrated in FIG. 2, the casing 33 and the frame 43 are moved in the direction coming close to each other, and either one of the die 1 and the molding target 2 disposed at the casing-33 side (in FIG. 2, the molding target 2) is held by the casing 33 and the frame 43.

In the separating step, as illustrated in FIG. 3, with the die 1 or the molding target 2 being held by the casing 33 and the frame 43, the casing 33 and the stage 32 are moved in a separating direction relative to each other. Accordingly, a gap is formed between the die 1 and the molding target 2, thereby forming the decompression chamber 40.

In the eliminating step, the fluid present in the gap formed in the separating step and between the die 1 and the molding target 2 is eliminated. At this time, it is preferable that the pressure-adjusting chamber 30 should have the same pressure through the pressure-difference adjusting means.

In the intimate contact step, as illustrated in FIG. 2, the casing 33 and the stage 32 are moved in a direction coming close to each other, thereby causing the die 1 to intimately contact the molding target 2.

In the transferring step, the mold pattern on the die 1 is transferred to the molding target 2 by thermal imprinting or optical imprinting. In the case of the thermal imprinting, first, the molding target 2 is heated to a temperature equal to or higher than the glass transition temperature by the heater, and the pressure of the fluid in the pressure-adjusting chamber 30 is increased by the pressure-adjusting means. In this case, the fluid in the pressure-adjusting chamber 30 pressurizes the die 1 and the molding target 2, and thus the mold pattern is transferred to the molding target 2. Next, the molding target 2 is cooled to a temperature lower than the glass transition temperature by the cooler, and thus the mold pattern is fixed on the molding target 2. Conversely, in the case of the optical imprinting, the molding target 2 is heated to a temperature equal to or higher than the glass transition temperature as needed by the heater, and the pressure of the fluid in the pressure-adjusting chamber 30 is increased. In this case, the fluid in the pressure-adjusting chamber 30 pressurizes the die 1 and the molding target 2, and thus the mold pattern is transferred to the molding target 2. Next, when the molding target 2 is irradiated with light of a predetermined wavelength by light emitting means, the mold pattern is fixed on the molding target 2.

The demolding step is not limited to any particular process as long as it can release the die 1 from the molding target 2, but for example, as illustrated in FIG. 5, the frame 43 and the stage 32 are moved relative to each other to form a slight gap between the die 1 and the molding target 2 intimately contacting each other, and the fluid is sprayed in this gap from the fluid spray means provided at the frame 43. Accordingly, the die 1 and the molding target 2 can be demolded quickly.

In the above explanation, the pressure-adjusting chamber 30 explained directly or indirectly pressurizes the die 1 and the molding target 2 by a fluid, but it is not always necessary for the pressure-adjusting chamber 30 to have a function of directly or indirectly pressurizing the die 1 and the molding target 2 by a fluid, and the pressure-adjusting chamber 30 may be a space utilized only at the time of pressure reduction, and pressurizing means that pressurizes the die 1 and the molding target 2 may be additionally provided.

It is to be understood that additional embodiments of the present invention described herein may be contemplated by one of ordinary skill in the art and that the scope of the present invention is not limited to the embodiments disclosed. While specific embodiments of the present invention have been illustrated and described, numerous modifications come to mind without significantly departing from the spirit of the invention, and the scope of protection is only limited by the scope of the accompanying claims.

REFERENCE SIGNS LIST

1 Die
2 Molding target
6 Fluid spray means
30 Pressure-adjusting chamber
32 Stage
33 Casing
34 Pressure-adjusting-chamber sealing means 35 Pressure-adjusting means
40 Decompression chamber
43 Frame
44 Decompression-chamber sealing means
45 Decompression means
46 Second moving means
47 Pressure-difference adjusting means
471 Communication channel

The invention claimed is:

1. An imprinting device that transfers a mold pattern on a die to a molding target, the imprinting device comprising:
   a casing forming a pressure-adjusting chamber;
   a stage supporting the die and the molding target;
   a frame encircling an outer circumference of the stage;
   first moving means that moves the casing and the stage in a direction coming close to each other or becoming distant from each other;
   second moving means that moves the casing and the frame in a direction coming close to each other or becoming distant from each other;
   pressure-adjusting means that adjusts pressure of a fluid in the pressure-adjusting chamber; and
   decompression means which decompresses a decompression chamber formed by the frame and the die or the molding target, and which eliminates the fluid present between the die and the molding target.

2. The imprinting device according to claim 1, further comprising pressure-difference adjusting means that adjusts a pressure difference between the pressure-adjusting chamber and the decompression chamber.

3. The imprinting device according to claim 1, wherein the frame comprises fluid spray means that sprays the fluid to a space between the die and the molding target.

4. The imprinting device according to claim 2, wherein the pressure-difference adjusting means comprises a communication channel that causes the pressure-adjusting chamber and the decompression chamber to be in communication with each other.

5. The imprinting device according to claim 1, further comprising pressure-adjusting-chamber sealing means that air-tightly seals the pressure-adjusting chamber.

6. The imprinting device according to claim 1, further comprising decompression-chamber sealing means that air-tightly seals the decompression chamber.

7. The imprinting device according to claim 3, wherein the frame has the fluid spray means located at positions facing each other across the molding target.

8. The imprinting device according to claim 1, further comprising a flexible film provided between the pressure-adjusting chamber and the die or the molding target.

9. The imprinting device according to claim 1, further comprising temperature adjusting means that adjusts a temperature of the molding target.

10. The imprinting device according to claim 1, further comprising light emitting means that emits light to the molding target.

11. The imprinting device according to claim 1, further comprising a carrier including a feeding roller that supplies the molding target, and a collecting roller that collects the molding target having undergone mold pattern transfer.

* * * * *